United States Patent
Parsa et al.

(10) Patent No.: US 9,601,225 B2
(45) Date of Patent: Mar. 21, 2017

(54) MULTIPLE-CAVITY VAPOR CELL STRUCTURE FOR MICRO-FABRICATED ATOMIC CLOCKS, MAGNETOMETERS, AND OTHER DEVICES

(71) Applicant: Texas Instruments Incorporated, Dallas, TX (US)

(72) Inventors: Roozbeh Parsa, San Jose, CA (US); Peter J. Hopper, San Jose, CA (US); William French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/862,503

(22) Filed: Sep. 23, 2015

(65) Prior Publication Data
US 2016/0012930 A1  Jan. 14, 2016

Related U.S. Application Data

(63) Continuation of application No. 13/949,018, filed on Jul. 23, 2013, now Pat. No. 9,169,974.

(51) Int. Cl.
  *H03L 7/26*  (2006.01)
  *G21K 5/08*  (2006.01)
  (Continued)

(52) U.S. Cl.
  CPC .................. *G21K 5/08* (2013.01); *F17C 3/00* (2013.01); *F17C 13/00* (2013.01); *G01R 33/02* (2013.01);
  (Continued)

(58) Field of Classification Search
  CPC ...... G01R 33/26; G01R 33/032; G01R 33/02; G01R 33/0322; G01R 33/04; G01R 33/24;
  (Continued)

(56) References Cited

U.S. PATENT DOCUMENTS 3,619,807 A   11/1971  Brun
5,657,340 A    8/1997  Camparo et al.
(Continued)

FOREIGN PATENT DOCUMENTS

WO   WO 91/17452 A1    11/1991
WO   WO 2009/084731 A1  7/2009
WO   WO 2012/142654 A1 10/2012

*Primary Examiner* — Arnold Kinkead
(74) *Attorney, Agent, or Firm* — Tuenlap D. Chan; Charles A. Brill; Frank D. Cimino

(57) ABSTRACT

An apparatus includes a vapor cell having multiple cavities fluidly connected by one or more channels. At least one of the cavities is configured to receive a first material able to dissociate into one or more gases that are contained within the vapor cell. At least one of the cavities is configured to receive a second material able to absorb at least a portion of the one or more gases. The vapor cell could include a first cavity configured to receive the first material and a second cavity fluidly connected to the first cavity by at least one first channel, where the second cavity is configured to receive the gas(es). The vapor cell could also include a third cavity fluidly connected to at least one of the first and second cavities by at least one second channel, where the third cavity is configured to receive the second material.

29 Claims, 5 Drawing Sheets

(51) Int. Cl.
*F17C 3/00* (2006.01)
*F17C 13/00* (2006.01)
*G04F 5/14* (2006.01)
*H05K 13/00* (2006.01)
*H03B 17/00* (2006.01)
*G01R 33/02* (2006.01)
*G21F 5/015* (2006.01)

(52) U.S. Cl.
CPC ............... *G04F 5/14* (2013.01); *H03B 17/00* (2013.01); *H03L 7/26* (2013.01); *H05K 13/00* (2013.01); *G21F 5/015* (2013.01)

(58) Field of Classification Search
CPC .......... G01R 33/32; G01R 33/34; G01R 3/00; H03L 7/26; G04F 5/14; G04F 5/145; G01N 21/3504; G01N 21/05; G01N 21/39; G01N 2021/0346; H03B 17/00; H05K 13/00

USPC ......... 331/94.1, 3; 324/252, 244; 250/432 R, 250/428; 137/561 R

See application file for complete search history.

(56) References Cited

U.S. PATENT DOCUMENTS

| | | | |
|---|---|---|---|
| 6,472,869 B1 | 10/2002 | Upschulte et al. | |
| 7,098,744 B2* | 8/2006 | Hayes | H03L 7/26 331/3 |
| 9,048,852 B2* | 6/2015 | Marmet | G04F 5/145 |
| 2012/0301631 A1 | 11/2012 | Overstolz et al. | |
| 2013/0015850 A1 | 1/2013 | Lindorfer et al. | |
| 2013/0015920 A1* | 1/2013 | Sato | G04F 5/14 331/94.1 |
| 2015/0377984 A1* | 12/2015 | Nagasaka | G01R 33/26 324/244.1 |

* cited by examiner

MULTIPLE-CAVITY VAPOR CELL STRUCTURE FOR MICRO-FABRICATED ATOMIC CLOCKS, MAGNETOMETERS, AND OTHER DEVICES

CROSS REFERENCE TO RELATED APPLICATION

Under 35 U.S.C. §120, this continuation application claims priority to and benefits of U.S. patent application Ser. No. 13/949,018 (TI-72039), filed on Jul. 23, 2013, the entirety of which is incorporated herein by reference.

TECHNICAL FIELD

This disclosure is generally directed to gas cells. More specifically, this disclosure is directed to a multiple-cavity vapor cell structure for micro-fabricated atomic clocks, magnetometers, and other devices.

BACKGROUND

Various types of devices operate using radioactive gas or other gas within a gas cell. For example, micro-fabricated atomic clocks (MFACs) and micro-fabricated atomic magnetometers (MFAMs) often include a cavity containing a metal vapor and a buffer gas. In some devices, the metal vapor and the buffer gas are created by dissociating cesium azide ($CsN_3$) into cesium vapor and nitrogen gas ($N_2$).

SUMMARY

This disclosure provides a multiple-cavity vapor cell structure for micro-fabricated atomic clocks, magnetometers, and other devices.

In a first example, an apparatus includes a vapor cell having multiple cavities fluidly connected by one or more channels. At least one of the cavities is configured to receive a first material able to dissociate into one or more gases that are contained within the vapor cell. At least one of the cavities is configured to receive a second material able to absorb at least a portion of the one or more gases.

In a second example, a system includes a vapor cell and an illumination source. The vapor cell includes multiple cavities fluidly connected by one or more channels. At least one of the cavities is configured to receive a first material able to dissociate into one or more gases that are contained within the vapor cell. At least one of the cavities is configured to receive a second material able to absorb at least a portion of the one or more gases. The illumination source is configured to direct radiation through at least one of the cavities.

In a third example, a method includes, in a vapor cell having multiple cavities fluidly connected by one or more channels, placing a first material into at least one of the cavities and placing a second material into at least one of the cavities. The method also includes dissociating at least a portion of the first material into one or more gases that are contained within the vapor cell. The method further includes absorbing at least a portion of the one or more gases using the second material.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 9, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

FIGS. 1 through 6 illustrate an example multiple-cavity vapor cell structure and fabrication technique in accordance with this disclosure. The multiple-cavity vapor cell structure can be used, for example, to receive an alkali-based material (such as cesium azide) and to allow dissociation of the alkali-based material into a metal vapor and a buffer gas (such as cesium vapor and nitrogen gas). However, this represents one example use of the multiple-cavity vapor cell structure. The vapor cell structure described here could be used in any other suitable manner.

Figure 1:
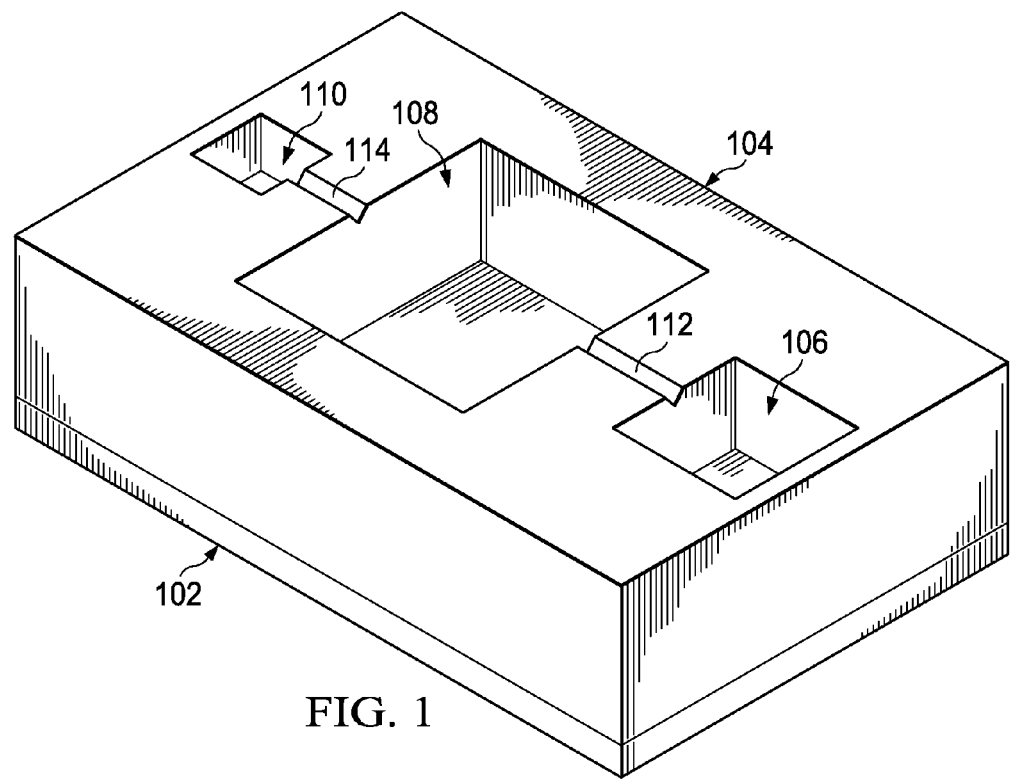
FIGS. 1 through 6 illustrate an example multiple-cavity vapor cell structure and fabrication technique in accordance with this disclosure.
Figure 2:
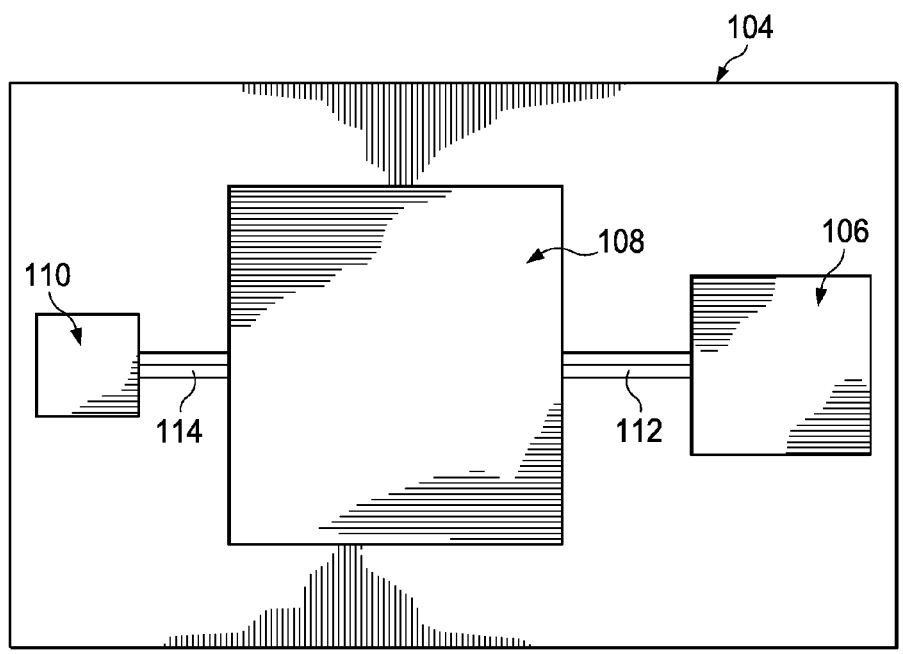

As shown in FIGS. 1 and 2, the multiple-cavity vapor cell structure includes a bottom wafer 102 and a middle wafer 104. The bottom wafer 102 generally represents a structure on which other components of the vapor cell structure can be placed. The bottom wafer 102 is also substantially optically transparent to radiation passing through the vapor cell structure during operation of a device, such as a micro-fabricated atomic clock, magnetometer, or other devices. The bottom wafer 102 can be formed from any suitable material(s) and in any suitable manner. The bottom wafer 102 could, for instance, be formed from glass, such as PYREX or BOROFLOAT glass.

The middle wafer 104 is secured to the bottom wafer 102, such as through bonding. The middle wafer 104 includes multiple cavities 106-110 through the middle wafer 104. Each cavity 106-110 could serve a different purpose in the vapor cell structure. For example, the cavity 106 can receive a material to be dissociated, such as cesium azide ($CsN_3$) or other alkali-based material. The cavity 106 can be referred to as a "reservoir cavity." The cavity 108 can receive gas from the cavity 106, such as a metal vapor and a buffer gas. Laser illumination or other illumination could pass through the cavity 108 during operation of a device, such as a micro-fabricated atomic clock, magnetometer, or other device. The cavity 108 can be referred to as an "interrogation cavity." The cavity 110 can receive at least one getter material, which can be used to absorb gas or other material(s) from the other cavities 106-108. The cavity 110 can be referred to as a "getter cavity."

One or more channels fluidly connect each adjacent pair of cavities in the vapor cell structure. For example, at least one channel 112 connects the reservoir cavity 106 and the interrogation cavity 108, and at least one channel 114 connects the interrogation cavity 108 and the getter cavity 110. Each channel 112-114 represents any suitable passageway through which gas or other material(s) can flow.

The middle wafer 104 could be formed from any suitable material(s) and in any suitable manner. For example, the middle wafer 104 could represent a silicon wafer. The cavities 106-110 and the channels 112-114 could be formed in the silicon wafer using one or more wet or dry etches. Each cavity 106-110 and channel 112-114 could have any suitable size, shape, and dimensions. Also, the relative sizes of the cavities 106-110 and channels 112-114 shown in FIGS. 1 through 6 are for illustration only, and each cavity 106-110 or channel 112-114 could have a different size relative to the other cavities or channels. Further, the relative depth of each channel 112-114 compared to the depth(s) of the cavities 106-110 is for illustration only, and each cavity 106-110 and channel 112-114 could have any other suitable depth. In addition, while each cavity 106-110 is shown as being formed completely through the wafer 104, each cavity 106-110 could be formed partially through the wafer 104.

Figure 3:
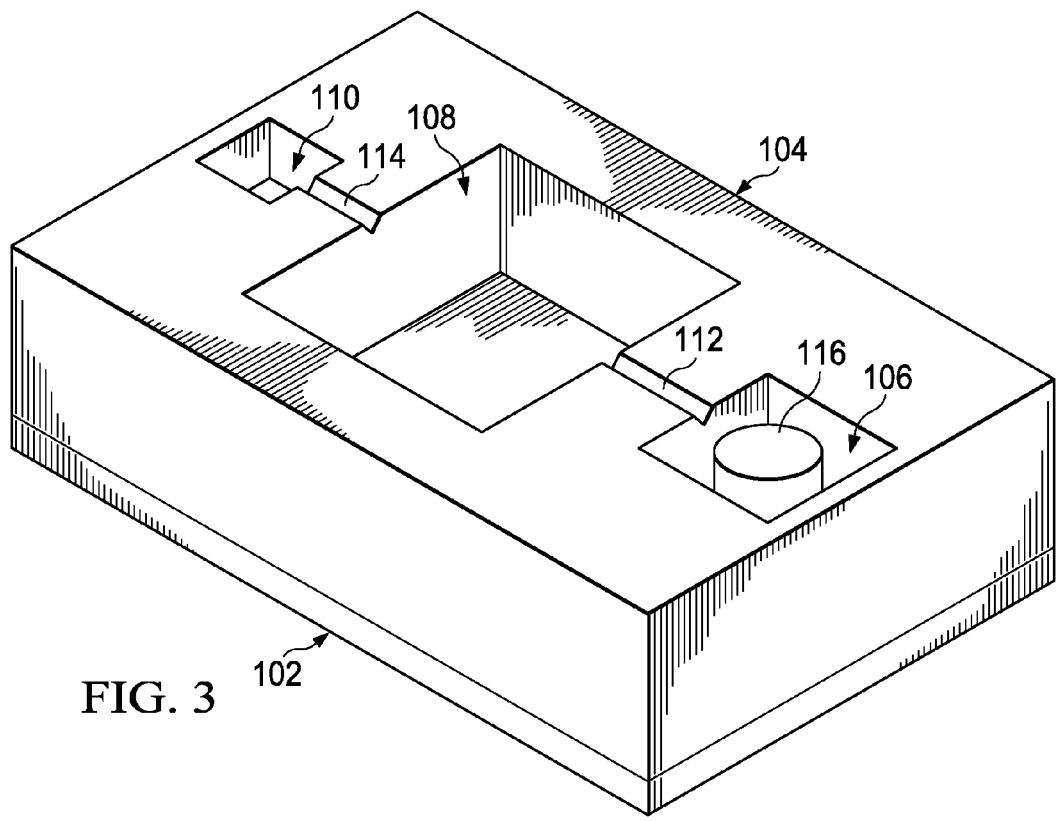
Figure 4:
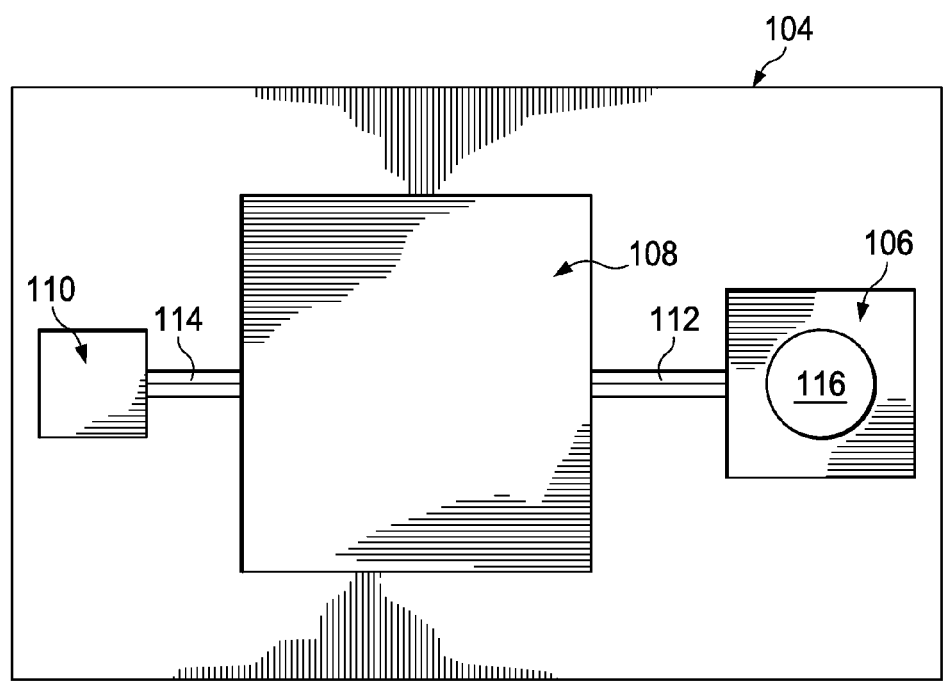

As shown in FIGS. 3 and 4, a material 116 is deposited into the reservoir cavity 106. The material 116 could represent any suitable material or combination of materials used to create one or more gases for the vapor cell structure. In some embodiments, the material 116 represents cesium azide, although any other suitable material(s) could be used in the vapor cell structure. The material 116 could be deposited into the reservoir cavity 106 in any suitable manner.

Figure 5:
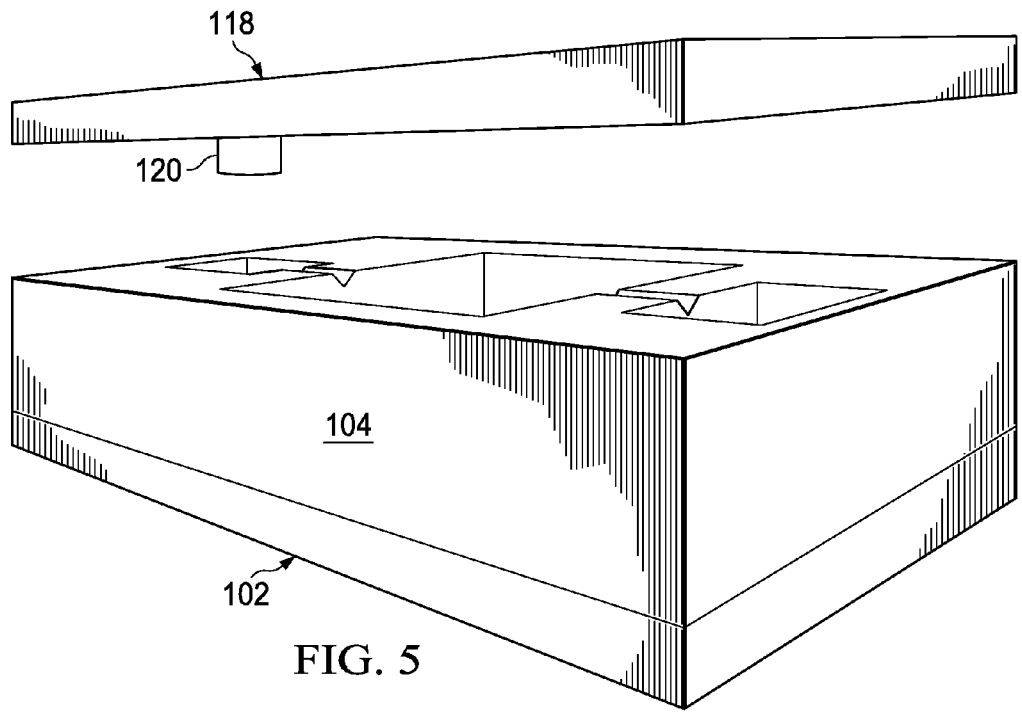
Figure 6:
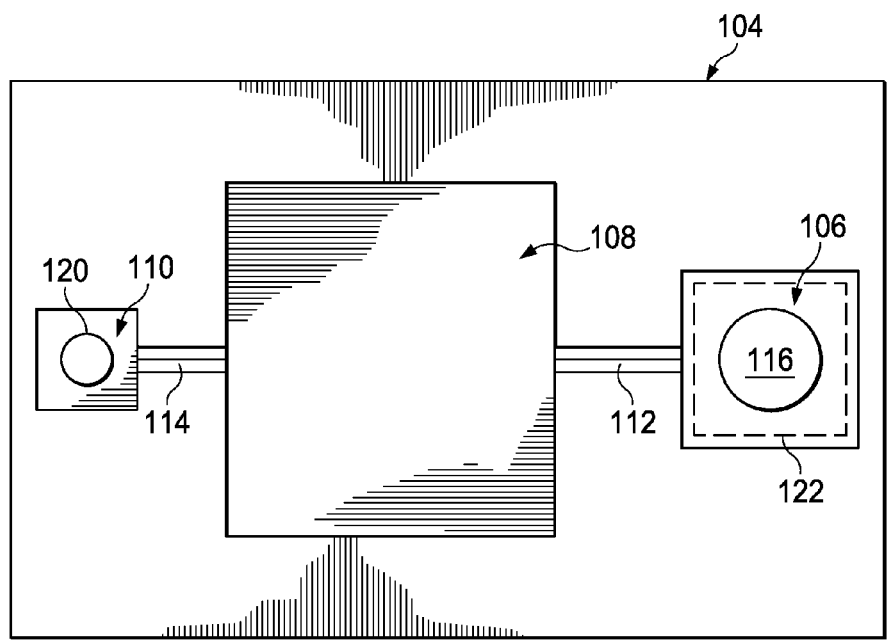

As shown in FIGS. 5 and 6, a top wafer 118 having a getter material 120 is secured to the middle wafer 104, such as through bonding. The top wafer 118 generally represents a structure that caps the cavities 106-110 and channels 112-114 of the middle wafer 104, thereby helping to seal material (such as gas) into the vapor cell structure. The top wafer 118 is also substantially optically transparent to radiation passing through the vapor cell structure during operation of a device, such as a micro-fabricated atomic clock, magnetometer, or other device. The top wafer 118 can be formed from any suitable material(s) and in any suitable manner. The top wafer 118 could, for instance, be formed from borosilicate glass, such as PYREX or BOROFLOAT glass.

In this example, the getter material 120 is located on the top wafer 118 so that it is positioned within the getter cavity 110 when the wafers 104, 118 are secured together. The getter material 120 can be used to absorb material within the cavities 106-110. For example, the getter material 120 could absorb at least a portion of the buffer gas released when the material 116 is dissociated. The getter material 120 can also be used to absorb any undesirable materials that may be present in the cavities 106-110, such as water vapor. The getter material 120 represents any suitable material for absorbing or otherwise removing gaseous or other material from the vapor cell structure, such as a zirconium-based alloy. In particular embodiments, the getter material 120 is used to absorb nitrogen gas ($N_2$) from the vapor cell structure.

The getter material 120 could have any suitable size, shape, and dimensions. The getter material 120 could also be formed in any suitable manner. For example, the getter material 120 could be deposited as a film on the top wafer 118 and then patterned and etched into the appropriate form. However, the getter material 120 could be deposited directly into the getter cavity 110. The getter material 120 can also be activated in any suitable manner. In particular embodiments, the getter material 120 is activated at temperatures associated with bonding or otherwise securing the middle wafer 104 to the top wafer 118 (such as around 300° C. or more). Note, however, that the getter material could be placed on the bottom wafer 102 as well.

At this point, various additional processing steps could occur to make the vapor cavity structure ready for use. For example, the vapor cavity structure generally or the reservoir cavity 106 in particular can be exposed to ultraviolet (UV) radiation to dissociate at least part of the material 116 in the reservoir cavity 106. In some embodiments, UV radiation can be used to dissociate cesium azide into cesium vapor and nitrogen gas ($N_2$). Note, however, that other mechanisms could be used to initiate the dissociation, such as thermal dissociation.

The dissociation of the material 116 creates gas inside the reservoir cavity 106, which can flow into the interrogation cavity 108 through the channel 112 and into the getter cavity 110 through the channel 114. Some of the gas can be absorbed by the activated getter material 120 in the getter cavity 110. The activated getter material 120 can absorb any suitable amount of gas depending on, for example, the area and thickness of the getter material 120.

In conventional devices, material is often dissociated in a single cavity, and the resulting gas is kept in the same cavity. Radiation can be passed through the gas in that single cavity during operation of a device, but residue from the original material may still exist in that single cavity. This residue can interfere with the optical properties of the cavity and lead to device failure.

In accordance with this disclosure, the material 116 can be placed in one cavity 106 and dissociated, and the resulting gas can be used in a different cavity 108 during device operation. Even if residue exists in the cavity 106, it may not interfere with the optical properties in the cavity 108. Also, the amount or composition of metal vapor and buffer gas in the interrogation cavity 108 can be precisely controlled. This is because the dissociation of the material 116 into the metal vapor and the buffer gas typically occurs at a known ratio and is controllable, such as based on the UV dosage selected. As a particular example, cesium azide dissociates into a known ratio of cesium vapor and nitrogen gas, and the amount of each can be controlled by controlling the UV exposure. Moreover, the getter material 120 can absorb a known quantity of gas, such as nitrogen gas, based on various factors like its dimensions. By controlling the UV dosage and the dimensions of the getter material 120, a manufacturer can precisely control the gas content created in the interrogation cavity 108.

This allows the optical properties of a vapor cell structure to be controlled, which allows accurate, reliable, and reproducible operation to be obtained in various vapor cell structures manufactured in this way. Moreover, different applications (such as micro-fabricated atomic clocks and micro-fabricated atomic magnetometers) often require different amounts of metal vapor and buffer gas in the interrogation cavity 108. This approach allows a vapor cell structure to be easily customized for a specific application. Overall, this approach provides a reliable technique for the manufacture of vapor cells for use in various applications with precise optical properties. This approach also increases the reliability and performance of the vapor cells since, for example, the getter material 120 absorbs unwanted gases and other materials present in the vapor cells.

The vapor cell structure could include any number of additional features depending on the implementation. For example, a portion 122 of the top wafer 118 (shown in outline in FIG. 6) could be thinner than the remainder of the top wafer 118. This may help to facilitate easier UV irradiation of the material 116. Note that any wafer 102, 104, 118 in the vapor cell structure could have a non-uniform thickness at any desired area(s) of the wafer(s). Also note that the portion 122 of the top wafer 118 could have any suitable size, shape, and dimensions and could be larger or smaller than the reservoir cavity 106. The portion 122 of the top wafer 118 could be thinned in any suitable manner, such as with a wet isotropic etch.

Although FIGS. 1 through 6 illustrate one example of a multiple-cavity vapor cell structure and fabrication technique, various changes may be made to FIGS. 1 through 6. For example, the vapor cell structure need not include three cavities and could include two cavities or more than three cavities. As a particular example, the cavities 106 and 110 could be combined into a single cavity that receives both the material 116 and the getter material 120. Also, the fabrication technique shown here is for illustration only, and other or additional operations could be used to fabricate the vapor cell structure. Further, the cavities 106-110 need not be arranged linearly, and the channels 112-114 need not be straight. Moreover, the interrogation cavity 108 need not be located between the reservoir cavity 106 and the getter cavity 110. Any arrangement of cavities connected by channels could be used, including non-linear and multi-level arrangements. In addition, the vapor cell structure could be used with any other material(s) 116 and getter material(s) 120 and is not limited to alkali-based materials or metal vapors and buffer gases.

Figure 7:
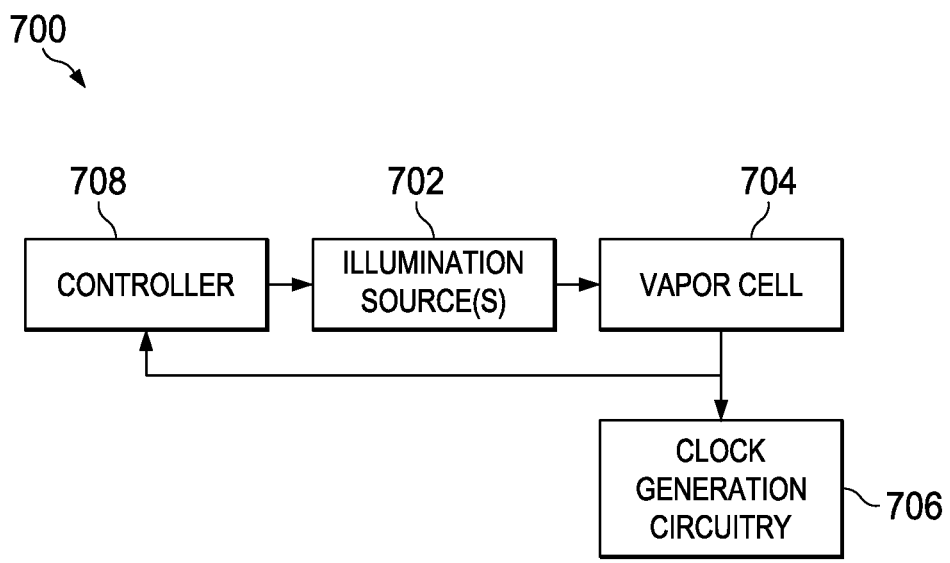
FIGS. 7 and 8 illustrate example devices containing at least one multiple-cavity vapor cell structure in accordance with this disclosure.
Figure 8:
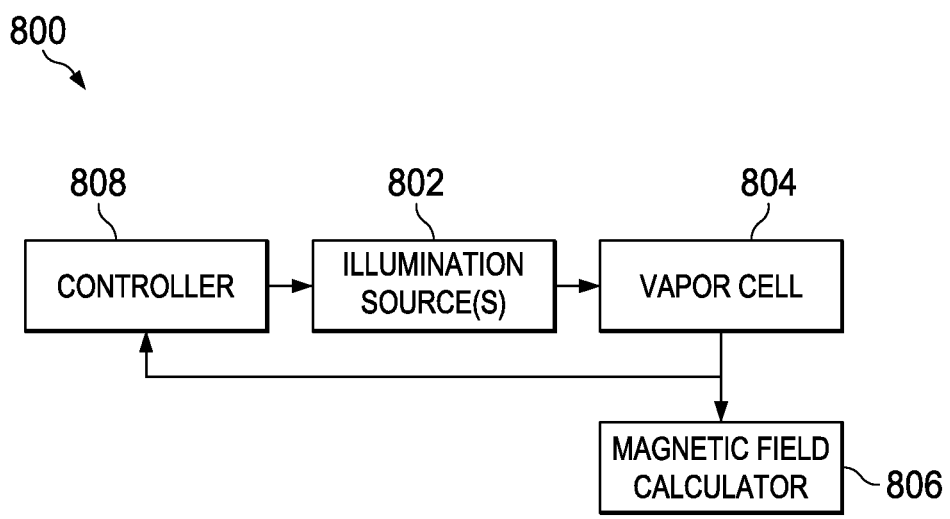

FIGS. 7 and 8 illustrate example devices containing at least one multiple-cavity vapor cell structure in accordance with this disclosure. As shown in FIG. 7, a device 700 represents a micro-fabricated atomic clock or other atomic devices. The device 700 here includes one or more illumination sources 702 and a vapor cell 704. Each illumination source 702 includes any suitable structure for generating radiation, which is directed through the vapor cell 704. Each illumination source 702 could, for example, include a laser or lamp.

The vapor cell 704 represents a multi-cavity vapor cell structure, such as the vapor cell structure described above. The radiation from the illumination source(s) 702 passes through the interrogation cavity 108 of the vapor cell 704 and interacts with the metal vapor. The radiation can also interact with one or more photodetectors that measure the radiation passing through the interrogation cavity 108. For example, photodetectors can measure radiation from one or more lasers or lamps.

Signals from the photodetectors are provided to clock generation circuitry 706, which uses the signals to generate a clock signal. When the metal vapor is, for example, rubidium 87 or cesium 133, the signal generated by the clock generation circuitry 706 could represent a highly-accurate clock. The signals from the photodetectors are also provided to a controller 708, which controls operation of the illumination source(s) 702. The controller 708 helps to ensure closed-loop stabilization of the atomic clock.

As shown in FIG. 8, a device 800 represents a micro-fabricated atomic magnetometer or other atomic magnetometer. The device 800 here includes one or more illumination sources 802 and a vapor cell 804. Each illumination source 802 includes any suitable structure for generating radiation, which is directed through the vapor cell 804. Each illumination source 802 could, for example, include a laser or lamp.

The vapor cell 804 represents a multi-cavity vapor cell structure, such as the vapor cell structure described above. The radiation from the illumination source(s) 802 can pass through the interrogation cavity 108 of the vapor cell 804 and interact with the metal vapor. The radiation can also interact with one or more photodetectors that measure the radiation passing through the interrogation cavity 108. For example, photodetector(s) can measure radiation from one or more lasers or lamps.

Signals from the photodetector(s) are provided to a magnetic field calculator 806, which uses the signals to measure a magnetic field passing through the interrogation cavity 108. The magnetic field calculator 806 here is capable of measuring extremely small magnetic fields. The signals from the photodetector(s) can also be provided to a controller 808, which controls operation of the illumination source(s) 802.

Although FIGS. 7 and 8 illustrate examples of devices 700 and 800 containing at least one multiple-cavity vapor cell structure, various changes may be made to FIGS. 7 and 8. For example, the devices 700 and 800 shown in FIGS. 7 and 8 have been simplified in order to illustrate example uses of the vapor cell structure described above. Atomic clocks and atomic magnetometers can have various other designs of varying complexity with one or multiple vapor cell structures.

Figure 9:
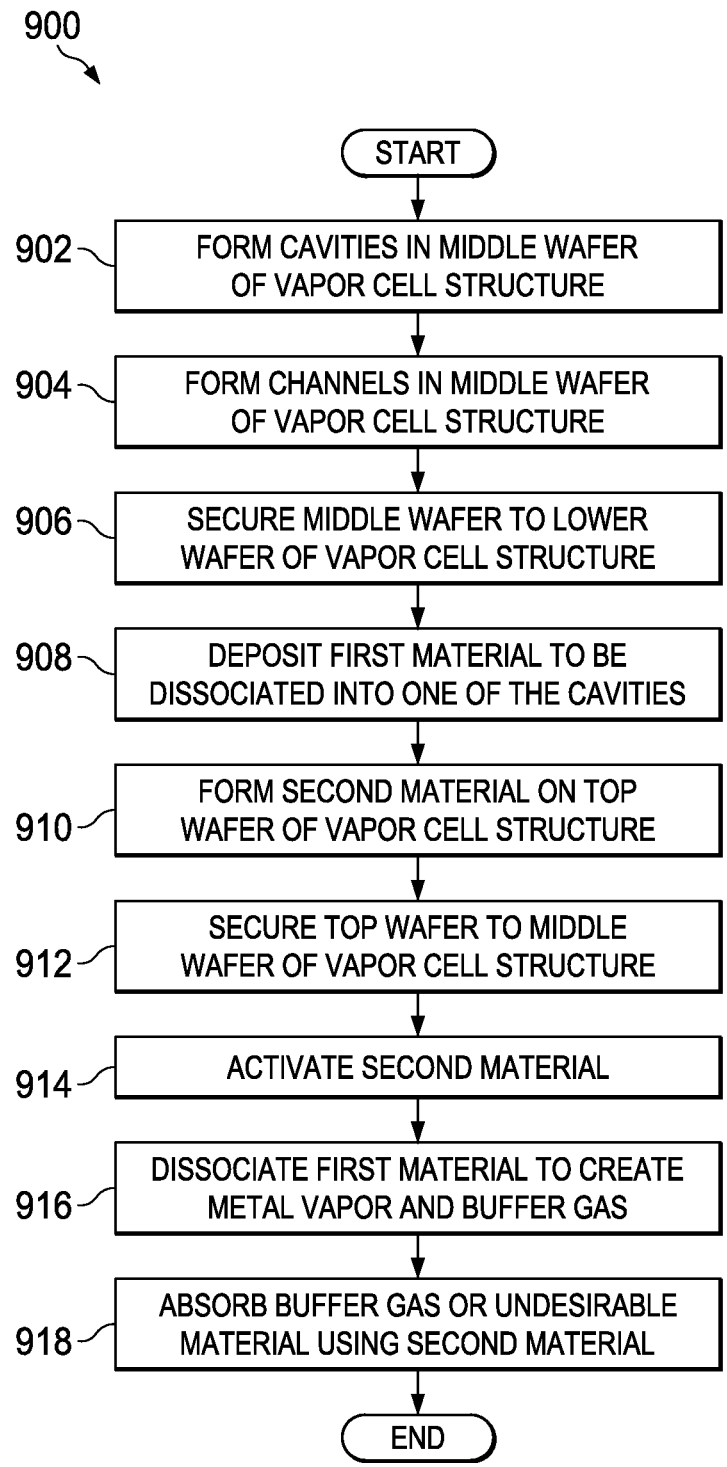
FIG. 9 illustrates an example method for forming a multiple-cavity vapor cell structure in accordance with this disclosure.

FIG. 9 illustrates an example method 900 for forming a multiple-cavity vapor cell structure in accordance with this disclosure. As shown in FIG. 9, multiple cavities are formed in a middle wafer of a vapor cell structure at step 902. This could include, for example, forming cavities 106-110 in a silicon wafer or other middle wafer 104. Any suitable technique could be used to form the cavities, such as a wet or dry etch. Channels are formed in the middle wafer of the vapor cell structure at step 904. This could include, for example, forming channels 112-114 in the silicon wafer or other middle wafer 104. Any suitable technique could be used to form the channels, such as a wet or dry etch. The formation of the cavities and channels could also overlap, such as when the same etch is used to form both the cavities 106-110 and the channels 112-114.

The middle wafer is secured to a lower wafer at step 906. This could include, for example, bonding the middle wafer 104 to the bottom wafer 102. If the cavities 106-110 are formed completely through the middle wafer 104, securing the middle wafer 104 to the bottom wafer 102 can seal the lower openings of the cavities 106-110.

A first material to be dissociated is deposited in one of the cavities at step 908. This could include, for example, depositing the material 116 into the reservoir cavity 106. Any suitable deposition technique could be used to deposit any suitable material(s) 116, such as an alkali-based material.

A second material is formed on a top wafer of the vapor cell structure at step 910. This could include, for example, forming a film of getter material 120 on the top wafer 118 and then patterning and etching the film. The getter material 120 can be positioned on the top wafer 118 in a location suitable for insertion into the getter cavity 110 of the middle wafer 104.

The top wafer is secured to the middle wafer at step 912. This could include, for example, bonding the top wafer 118 to the middle wafer 104. Securing the top wafer 118 to the middle wafer 104 can seal the upper openings of the cavities 106-110. At this point, the second material is located within the getter cavity 110. The second material is activated at step 914. This could include, for example, applying heat of at least about 300° C. to the getter material 120. In some embodiments, the heat could be generated during step 912 when the top wafer 118 is secured to the middle wafer 104.

The first material is dissociated to create metal vapor and buffer gas at step 916. This could include, for example, applying UV radiation to the material 116 through the bottom wafer 102 or the top wafer 118. This could also include converting at least a portion of the material 116 into the metal vapor and buffer gas. Note, however, that other dissociation techniques could also be used.

At least a portion of the buffer gas, undesirable material(s), or other material(s) in the vapor cell structure is/are absorbed using the second material at step 918. This could include, for example, absorbing at least some of the buffer gas, water vapor, or other material(s) using the getter material 120.

In this way, the amounts of metal vapor and buffer gas in the interrogation cavity 108 of the vapor cell structure can be precisely controlled. As a result, the vapor cell structure can be manufactured with specific optical properties suitable for a particular application. Moreover, multiple vapor cell structures can be fabricated using this technique, and each vapor cell structure can have optical properties suitable for each particular application.

Although FIG. 9 illustrates one example of a method 900 for forming a multiple-cavity vapor cell structure, various changes may be made to FIG. 9. For example, as noted above, various modifications can be made to the fabrication process. Also, while shown as a series of steps, various steps in FIG. 9 could overlap, occur in parallel, or occur in a different order.

It may be advantageous to set forth definitions of certain words and phrases used throughout this patent document. The terms "top," "middle," and "bottom" refer to structures in relative positions in the figures and do not impart structural limitations on how a device is manufactured or used. The term "secured" and its derivatives mean to be attached, either directly or indirectly via another structure. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A vapor cell, comprising:
a first wafer;
a second wafer positioned adjacent to the first wafer, the second wafer defining a first opening, a second opening independent of the first opening, and a third opening independent of the first opening and the second opening; and
a third wafer arranged with the second wafer and the first wafer to enclose:
a first cavity overlapping with the first opening;
a second cavity overlapping with the second opening and fluidly connected with the first cavity; and
a third cavity overlapping with the third opening and fluidly connected with the second cavity.

2. The vapor cell of claim 1, further comprising:
a dissociable material deposited in the first cavity, the dissociable material initiated to dissociate a gas to be transferred to the second cavity.

3. The vapor cell of claim 2, wherein the dissociable material is deposited on the first wafer and facing the first cavity.

4. The vapor cell of claim 1, further comprising:
a getter material deposited in the third cavity, the getter material configured to absorb a gas transferred to the second cavity.

5. The vapor cell of claim 4, wherein the dissociable material is deposited on the third wafer and facing the third cavity.

6. The vapor cell of claim 1, wherein the second wafer is positioned between and secured to the first wafer and the third wafer.

7. The vapor cell of claim 1, wherein the first wafer is substantially transparent to ultra violet radiation.

8. The vapor cell of claim 1, further comprising:
a first channel defined in the second wafer, the first channel fluidly connecting the first cavity with the second cavity; and
a second channel defined in the second wafer, the second channel fluidly connecting the second cavity with the third cavity.

9. A vapor cell, comprising:
a first wafer;
a second wafer positioned adjacent to the first wafer, the second wafer defining a first opening and a second opening independent of the first opening; and
a third wafer arranged with the second wafer and the first wafer to enclose:
a first cavity overlapping with the first opening; and
a second cavity overlapping with the second opening and fluidly connected with the first cavity.

10. The vapor cell of claim 9, further comprising:
a dissociable material deposited in the first cavity, the dissociable material initiated to dissociate a gas to be transferred to the second cavity.

11. The vapor cell of claim 10, wherein the dissociable material is deposited on the first wafer and facing the first cavity.

12. The vapor cell of claim 9, further comprising:
a getter material deposited in the second cavity, the getter material configured to absorb a gas received from the first cavity.

13. The vapor cell of claim 12, wherein the dissociable material is deposited on the third wafer and facing the second cavity.

14. The vapor cell of claim 9, wherein the second wafer is positioned between and secured to the first wafer and the third wafer.

15. The vapor cell of claim 9, wherein the first wafer is substantially transparent to ultra violet radiation.

16. The vapor cell of claim 9, further comprising:
a channel defined in the second wafer, the channel fluidly connecting the first cavity with the second cavity.

17. A system, comprising:
a first wafer;
a second wafer positioned adjacent to the first wafer, the second wafer defining a first opening and a second opening independent of the first opening;
a third wafer arranged with the second wafer and the first wafer to enclose:
  a first cavity overlapping with the first opening; and
  a second cavity overlapping with the second opening and fluidly connected with the first cavity; and
an illumination source configured to direct radiation to one of the first cavity or the second cavity.

18. The system of claim 17, further comprising:
a dissociable material deposited in the first cavity, the dissociable material initiated to dissociate a gas to be transferred to the second cavity.

19. The system of claim 18, wherein the dissociable material is deposited on the first wafer and facing the first cavity.

20. The system of claim 17, further comprising:
a getter material deposited in the second cavity, the getter material configured to absorb a gas received from the first cavity.

21. The system of claim 20, wherein the dissociable material is deposited on the third wafer and facing the second cavity.

22. The vapor cell of claim 9, wherein the second wafer is positioned between and secured to the first wafer and the third wafer.

23. The system of claim 17, wherein the first wafer is substantially transparent to ultra violet radiation.

24. The system of claim 17, further comprising:
a channel defined in the second wafer, the channel fluidly connecting the first cavity with the second cavity.

25. The system of claim 17, further comprising:
a photodetector configured to measure the radiation passing through the second cavity; and
a clock generation circuitry coupled to the photodetector, the clock generation circuitry configured to generate a clock signal based on the measured radiation.

26. The system of claim 17, further comprising:
a photodetector configured to detect the radiation passing through the second cavity; and
a magnetic field calculator coupled to the photodetector, the magnetic field calculator configured to generate a magnetic field measurement based on the detected radiation.

27. A vapor cell, comprising:
a first wafer;
a second wafer positioned adjacent to the first wafer, the second wafer defining a first opening, a second opening independent of the first opening, and a third opening independent of the first opening and the second opening;
a third wafer arranged with the second wafer and the first wafer to enclose:
  a first cavity overlapping with the first opening;
  a second cavity overlapping with the second opening and fluidly connected with the first cavity; and
  a third cavity overlapping with the third opening and fluidly connected with the second cavity; and
a getter material deposited in the third cavity, the getter material configured to absorb a gas transferred to the second cavity.

28. A vapor cell, comprising:
a first wafer;
a second wafer positioned adjacent to the first wafer, the second wafer defining a first opening and a second opening independent of the first opening;
a third wafer arranged with the second wafer and the first wafer to enclose:
  a first cavity overlapping with the first opening; and
  a second cavity overlapping with the second opening and fluidly connected with the first cavity; and
a getter material deposited in the third cavity, the getter material configured to absorb a gas transferred to the second cavity.

29. A system, comprising:
a first wafer;
a second wafer positioned adjacent to the first wafer, the second wafer defining a first opening and a second opening independent of the first opening;
a third wafer arranged with the second wafer and the first wafer to enclose:
  a first cavity overlapping with the first opening; and
  a second cavity overlapping with the second opening and fluidly connected with the first cavity;
an illumination source configured to direct radiation to one of the first cavity or the second cavity; and
a getter material deposited in a third cavity, the getter material configured to absorb a gas transferred to the second cavity.

* * * * *